(12) United States Patent
Godo

(10) Patent No.: US 7,695,177 B2
(45) Date of Patent: *Apr. 13, 2010

(54) OPTICAL DEVICE AND ILLUMINATION DEVICE

(75) Inventor: Hirokazu Godo, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/202,661

(22) Filed: Sep. 2, 2008

(65) Prior Publication Data

US 2009/0010004 A1 Jan. 8, 2009

Related U.S. Application Data

(63) Continuation of application No. 11/288,803, filed on Nov. 29, 2005, now Pat. No. 7,470,051.

(30) Foreign Application Priority Data

Dec. 2, 2004 (JP) .............................. 2004-349612

(51) Int. Cl.
*F21V 7/04* (2006.01)
(52) U.S. Cl. ..................... 362/555; 362/560; 362/551
(58) Field of Classification Search ................ 362/555, 362/800, 333
See application file for complete search history.

(56) References Cited

U.S. PATENT DOCUMENTS

| 4,915,479 | A | * | 4/1990 | Clarke ......................... 349/62 |
| 5,040,868 | A | | 8/1991 | Waitl et al. |
| 5,462,700 | A | * | 10/1995 | Beeson et al. .............. 264/1.27 |
| 5,764,845 | A | | 6/1998 | Nagatani et al. |
| 6,527,411 | B1 | * | 3/2003 | Sayers ......................... 362/245 |
| 6,939,009 | B2 | * | 9/2005 | Fischer et al. ................ 353/43 |
| 7,194,185 | B2 | * | 3/2007 | Watanabe .................... 385/146 |
| 7,470,051 | B2 | * | 12/2008 | Godo ........................ 362/555 |
| 2002/0136027 | A1 | * | 9/2002 | Hansler et al. .............. 362/559 |
| 2003/0219207 | A1 | * | 11/2003 | Guy ............................ 385/49 |
| 2004/0041984 | A1 | * | 3/2004 | Tani et al. ..................... 353/20 |
| 2004/0057252 | A1 | * | 3/2004 | Coushaine ................... 362/555 |
| 2006/0044806 | A1 | * | 3/2006 | Abramov et al. ............ 362/337 |
| 2006/0083013 | A1 | * | 4/2006 | Wanninger et al. .......... 362/509 |

FOREIGN PATENT DOCUMENTS

JP 3-11771 1/1991

(Continued)

OTHER PUBLICATIONS

Office Action dated Jun. 9, 2009 from corresponding Japanese Patent Application No. 2004-349612.

*Primary Examiner*—Anabel M Ton
(74) *Attorney, Agent, or Firm*—Volpe and Koenig P.C.

(57) ABSTRACT

An optical device guides illuminating light from a light source and includes a light-guiding unit including an incidence face which the illuminating light from the light source is incident upon, an emission face which emits the illuminating light and has a larger area than the incidence face, and a reflection face which guides rays of the illuminating light which are incident from the incidence face to the emission face, and a holder which secures the light-guiding unit in position with the light source. The light-guiding unit and the holder are connected together on the emission face side of the light-guiding unit.

16 Claims, 11 Drawing Sheets

FOREIGN PATENT DOCUMENTS

| | | |
|---|---|---|
| JP | 7-98416 | 4/1995 |
| JP | 10-031138 | 2/1998 |
| JP | 10-106327 | 4/1998 |
| JP | 10-199315 | 7/1998 |
| JP | 2000-266965 | 9/2000 |
| JP | 2002-267893 | 9/2002 |
| JP | 2004-093623 | 3/2004 |
| JP | 2004-094115 | 3/2004 |

* cited by examiner

OPTICAL DEVICE AND ILLUMINATION DEVICE

CROSS REFERENCE TO RELATED APPLICATIONS

This application is a continuation of U.S. patent application Ser. No. 11/288,803, filed on Nov. 29, 2005, which claims priority to Japanese Patent Application No. 2004-349612, filed Dec. 2, 2004, which are incorporated by reference as if fully set forth.

BACKGROUND

1. Field of the Invention

The present invention relates to an optical device and an illumination device.

2. Description of Related Art

There is a conventional illumination device which can obtain illuminating light having high directivity via a taper rod consisting of a tapered light-guide which is disposed on a light source having an LED which emits diffused light. See, for example, Japanese Patent Publication No. 2004-94115 and Japanese Patent Publication No. 2004-93623. The taper rod must be positioned for the light source.

In the field of optical fibers, various methods for adjusting the alignment of an optical component when attaching it a light source in this manner have been proposed. See, for example, Japanese Patent Publication No. Hei 10-031138, Japanese Patent Publication No. 2000-266965, and Japanese Patent Publication No. 2002-267893.

SUMMARY

The present invention employs the following structure.

An optical device of this invention guides illuminating light from a light source. The optical device comprises a columnar light-guiding unit including an incidence face which the illuminating light from the light source is incident upon, an emission face which emits the illuminating light and has a larger area than the incidence face, and a reflection face which guides rays of the illuminating light which is incident from the incidence face to the emission face while bringing the rays to total internal reflection, and a holder which secures the columnar light-guiding unit in position with respect to the light source. The columnar light-guiding unit and the holder are connected together in a single piece only on the reflection face on the emission face side of the columnar light-guiding unit.

According to the optical device of this invention, a plurality of the reflection faces are disposed on the columnar light-guiding unit, and one of the holders is joined to each of two of the reflection faces.

According to the optical device of this invention, the columnar light-guiding unit and the holder are molded in a single piece of the same material.

According to the optical device of this invention, the holder includes a connector for connecting to the light source, the connector being disposed further to the incidence face side than the emission face side.

According to the optical device of this invention, the distance between the emission face and the connector is approximately the same as the distance between the emission face and the incidence face.

An illumination apparatus according to this invention comprises the optical device according to this invention and a light source, which includes a light-emitting diode which emits illuminating light and a base which holds the light-emitting diode. The holder is secured in position to the base such that the incidence face is opposite the light-emitting diode.

According to the illumination apparatus of this invention, the base is provided with a positioning section for positioning with respect to the incidence face.

According to the illumination apparatus of this invention, the holder is adhesively secured to the base with the connector therebetween.

The illumination apparatus of this invention further comprises a securing section which secures the connector to the base.

According to the illumination apparatus of this invention, the connector protrudes toward the base, and the securing section further comprises an engaging groove which the connector attached to the base can be engaged into, and a clasping member which securely engages and fastens the connector into the engaging groove.

The illumination apparatus of this invention further comprises a convexity which is formed on the connector and protrudes in the direction of the base, and a concavity which is formed in the base and allows the convexity to be inserted therein.

According to the illumination apparatus of this invention, the securing section further comprises a holder side through-hole which is provided in the connector and faces the base side, a base side through-hole which is provided in the base and can be aligned with the holder side through-hole, and a pointed pin which can be inserted through the holder side through-hole and the base side through-hole.

According to the illumination apparatus of this invention, the securing section further comprises a pointed pin which is formed in a single piece with the connector and protrudes in the direction of the base, and a base side through-hole which is formed in the base and allows the pin to be inserted.

According to the illumination apparatus of this invention, the pin is long enough to protrude from the base side through-hole when inserted therein, forming a protruding section, and the protruding section is thermally crimped to the base.

According to the illumination apparatus of this invention, the securing section comprises a holder side through-hole which is provided in the connector and faces the base side, an external screw section which can be inserted through the holder side through-hole, and an internal screw section which is provided in the base and allows the external screw section to be screwed therein after insertion through the holder side through-hole.

Another aspect of the present invention is directed to an optical device which guides illuminating light from a light source. The optical device includes a light-guiding unit including an incidence face which the illuminating light from the light source is incident upon, an emission face which emits the illuminating light and has a larger area than the incidence face, and a reflection face which guides rays of the illuminating light which are incident from the incidence face to the emission face, and a holder which secures the light-guiding unit in position with the light source. The light-guiding unit and the holder are connected together on the emission face side of the light-guiding unit.

Another aspect of the present invention is directed toward a method of mounting an optical device to a light source. The method includes providing an optical device having a light-guiding unit having an incidence face which illuminating light from the light source is incident upon, an emission face which emits the illuminating light and has a larger area than the incidence face, and a reflection face which guides rays of the illuminating light which are incident from the incidence face to the emission face, and a holder having a first portion connected to the emission face side of the light guiding unit and a second portion having an elongated extension member. The method further includes providing a light source including a base having a through-hole and a light emitting diode positioned on the base and inserting the elongated extension member into the through-hole in the base to secure the optical device to the light source.

DETAILED DESCRIPTION OF THE PREFERRED EMBODIMENTS

A first embodiment of the present invention will be explained with reference to FIGS. 1 through 3.

Figure 1:
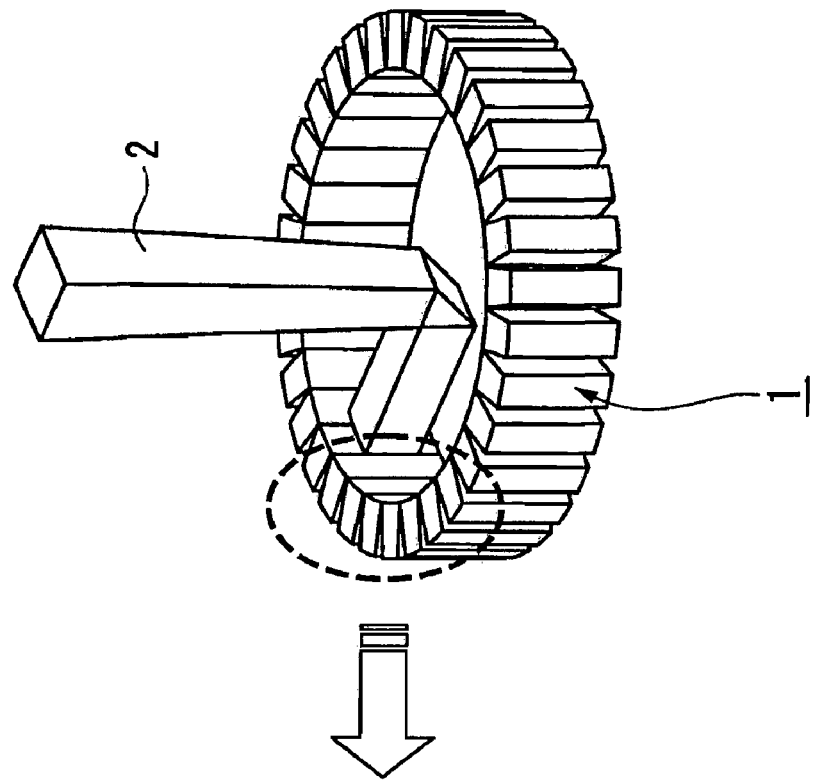
FIG. 1 is an explanatory diagram of an alignment of illumination apparatuses according to a first embodiment of this invention.
Figure 1:
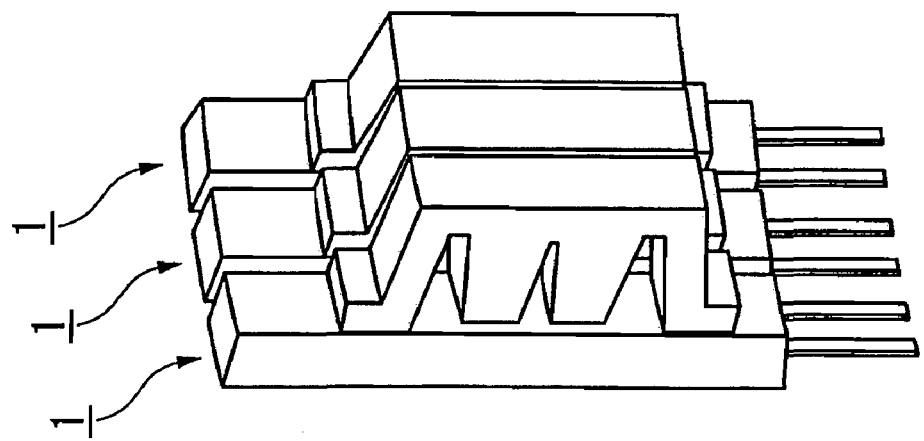

As shown in FIG. 1, a plurality of illumination apparatuses 1 of this invention are arranged in a circle, which has as its center point an intersection region where the normal lines of emission faces 12 of optical devices 7 explained later intersect at approximately one point, and illuminating lights which are emitted from these illumination apparatuses 1 are collected and emitted by an L-shaped angular light-guiding rod 2. A projector or the like (not shown) is used as an illumination source.

Figure 2:
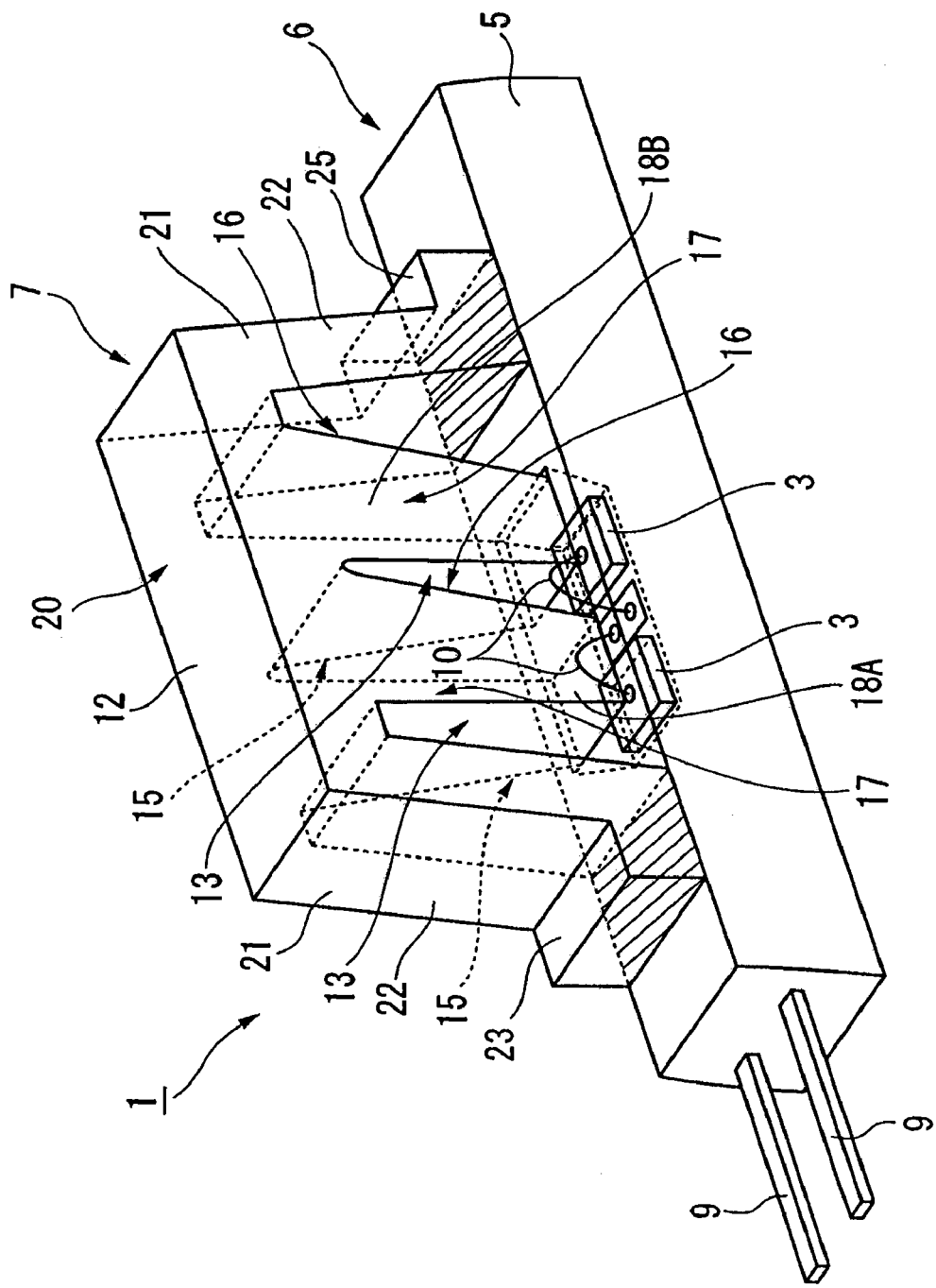
FIG. 2 is a perspective view of an illumination apparatus according to the first embodiment of this invention.
Figure 3:
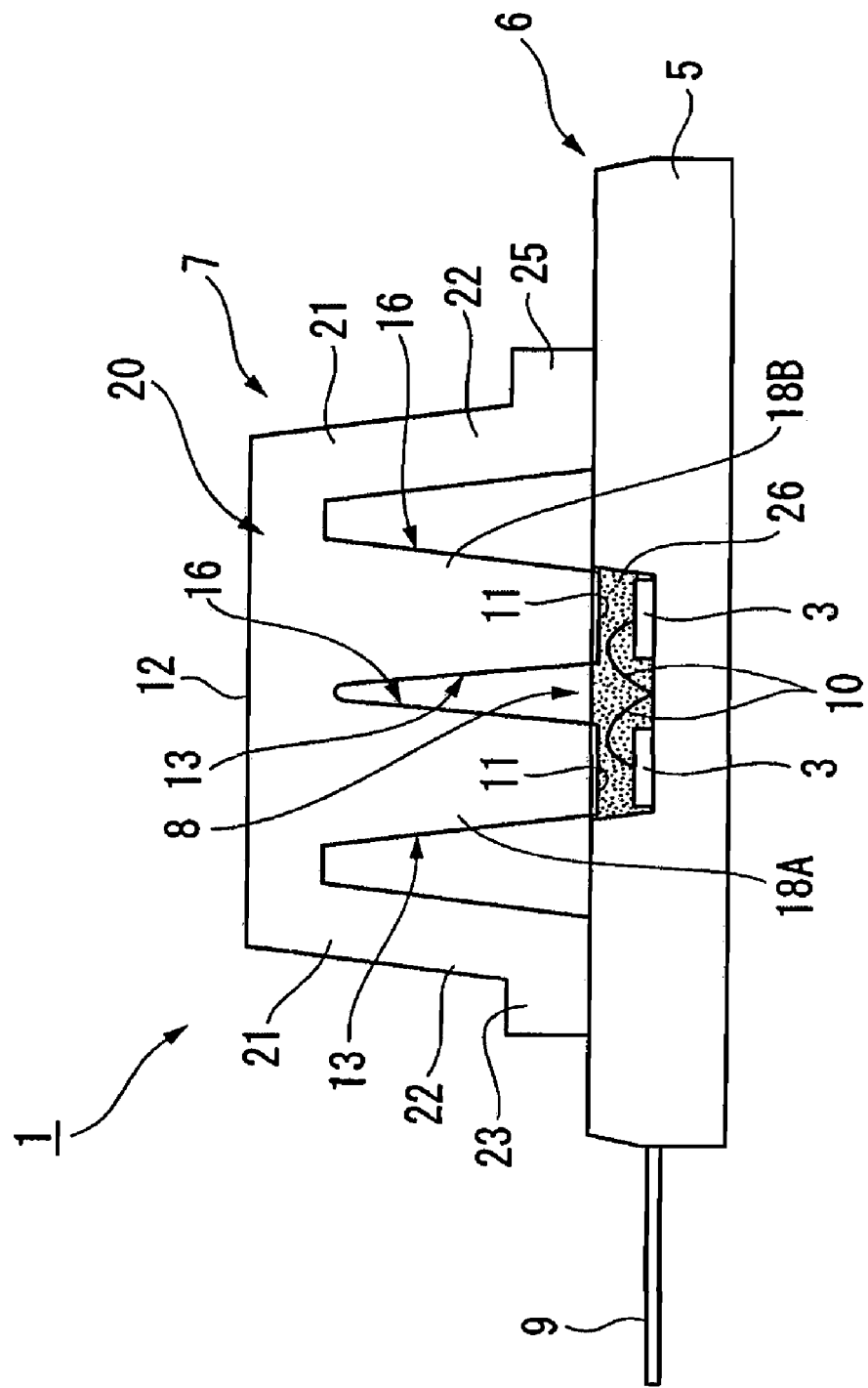
FIG. 3 is a cross-sectional side view of an illumination apparatus according to the first embodiment of this invention.

As shown in FIGS. 2 and 3, each illumination apparatus 1 comprises two light-emitting diodes (LEDs) 3 which emit illuminating light, a light source 6 which includes a cuboid base 5 for holding the LEDs 3, and the optical device 7 which guides the illuminating light from the light source 6.

A cavity 8 for internally containing the LEDs 3 is provided in the long direction of the base 5. This cavity 8 is large enough to allow the insertion of incidence faces of two taper rods 18A and 18B which will be explained later.

Electrodes 9 are attached at one end side of the base 5, the LEDs 3 being electrically connected to the electrodes 9 by bonding wires 10.

The optical device 7 includes a columnar light-guiding unit 20 which has two identically-shaped taper rods 18A and 18B, each of which contains an incidence face 11 which the illuminating light from the light source 6 is incident upon, an emission face 12 which has a larger area than the incidence face 11 and emits the illuminating light, and a plurality of reflection faces 13, 15, 16, and 17 for bringing all rays of the illuminating light to total internal reflection which are incident thereto from the incidence face 11 while guiding them to the emission face 12. The two taper rods 18A and 18B are joined together on the emission face 12 side. In addition, the optical device 7 includes holders 21 which securely position the incidence faces 11 of the taper rods 18A and 18B with respect to the light source 6 with the incidence faces 11 opposite each of the LEDs 3.

The taper rods 18A and 18B are formed in a shape that tapers from the emission face 12 side toward the incidence face 11 side.

The columnar light-guiding unit 20 and the holders 21 are molded together by a transparent material such as polycarbonate, and are connected at only two points; namely, at the reflection face 13 on the emission face 12 of the taper rod 18A in the long direction of the base 5 and at the reflection face 15 on the emission face 12 side of the other taper rod 18B.

The holders 21 include two supporters 22 which extend from both ends of the emission face 12 sides of the columnar light-guiding unit 20 in the direction of the incidence faces 11, and connectors 23 and 25 which connect to the light source 6 and are arranged at respective tips of the supporters 22.

The holders 21 are securely attached to the base 5 of the light source 6 via the connectors 23 and 25.

The connectors 23 and 25 include the ends of the supporters 22 and protrude in the long direction of the base 5.

That is, the holders 21 are formed in the direction that the taper rods 18A and 18B are arranged in, in a gate-like shape on either side of the columnar light-guiding unit 20 so as to support the emission face 12 side. The connectors 23 and 25 are arranged on the incidence face 11 sides of the taper rods 18A and 18B, the lengths of the supporters 22 being adjusted such that the distance between the emission faces 12 and the connectors 23 and 25 is approximately equal to the distance between the emission faces 12 and the incidence faces 11. The connectors 23 and 25 are arranged in approximately the same plane as the incidence faces 11.

Subsequently, a manufacturing method of the illumination apparatus 1 including the optical device 7 according to this embodiment will be explained, along with the effects and advantages thereof.

After the two LEDs 3 have been mounted alongside each other in the cavity 8 of the base 5, they are connected to the electrodes 9 by the bonding wires 10.

The incidence faces 11 of the taper rods 18A and 18B are then inserted into the cavity 8, and the optical device 7 is mounted on the base 5.

At this time, the connectors 23 and 25 are secured to the base 5 using an adhesive.

The cavity 8 is filled with a sealing resin 26, such as silicon resin, while ensuring that no air layer remains over the incidence faces 11 and that the sealing resin 26 does not stick to the reflection faces 13, 15, 16, and 17 of the taper rods 18A and 18B.

This obtains the illumination apparatus 1.

Alternatively, the connectors 23 and 25 may be secured to the base 5 after filling the cavity 8 with the sealing resin 26, while joining the sealing resin 26 to the incidence faces 11 of the taper rods 18A and 18B in an airtight connection.

According to this optical device 7, since the columnar light-guiding unit 20 and the holders 21 form a single piece, the number of components and the assembly cost can be reduced. Furthermore, since the emission faces 12 have larger areas than the incidence faces 11, the holders 21 and the columnar light-guiding unit 20 are connected only on the emission face 12 sides where the light reflection density is smaller than that of the incidence faces 11. In addition, since there are no contact sections on the incidence face 11 sides, the columnar light-guiding unit 20 can be held stably using two connection sections while suppressing optical loss of the reflected light in the taper rods 18A and 18B.

Since the columnar light-guiding unit 20 and the holders 21 are formed in a single piece, processing errors in the optical device 7 can be further reduced, as can manufacturing costs.

Since the connectors 23 and 25 of the holders 21 are attached to the light source 6, the incidence faces 11 can be easily and stably positioned with respect to the light source 6. Arranging the incidence faces 11 near to the connectors 23 and 25 at this time makes it even easier to position them with respect to the light source 6.

Since the illumination apparatus 1 includes the optical device 7 of this invention, when a plurality of the optical devices 7 are arranged as in the example shown in FIG. 1, the columnar light-guiding unit 20 can be held in the same direction as the direction of joining the reflection faces 13 and 15 which the holders 21 are connected to. This enables the holders 21 to be aligned close to each other without mutual interference.

Since the optical device 7 is adhesively secured to the light source 6, it can be connected to the light source 6 more firmly, enabling the number of components and the assembly cost to be reduced. The columnar light-guiding unit 20 can be held while suppressing optical loss of the reflected light in the taper rods 18A and 18B, obtaining highly efficient illuminating light.

Figure 4:
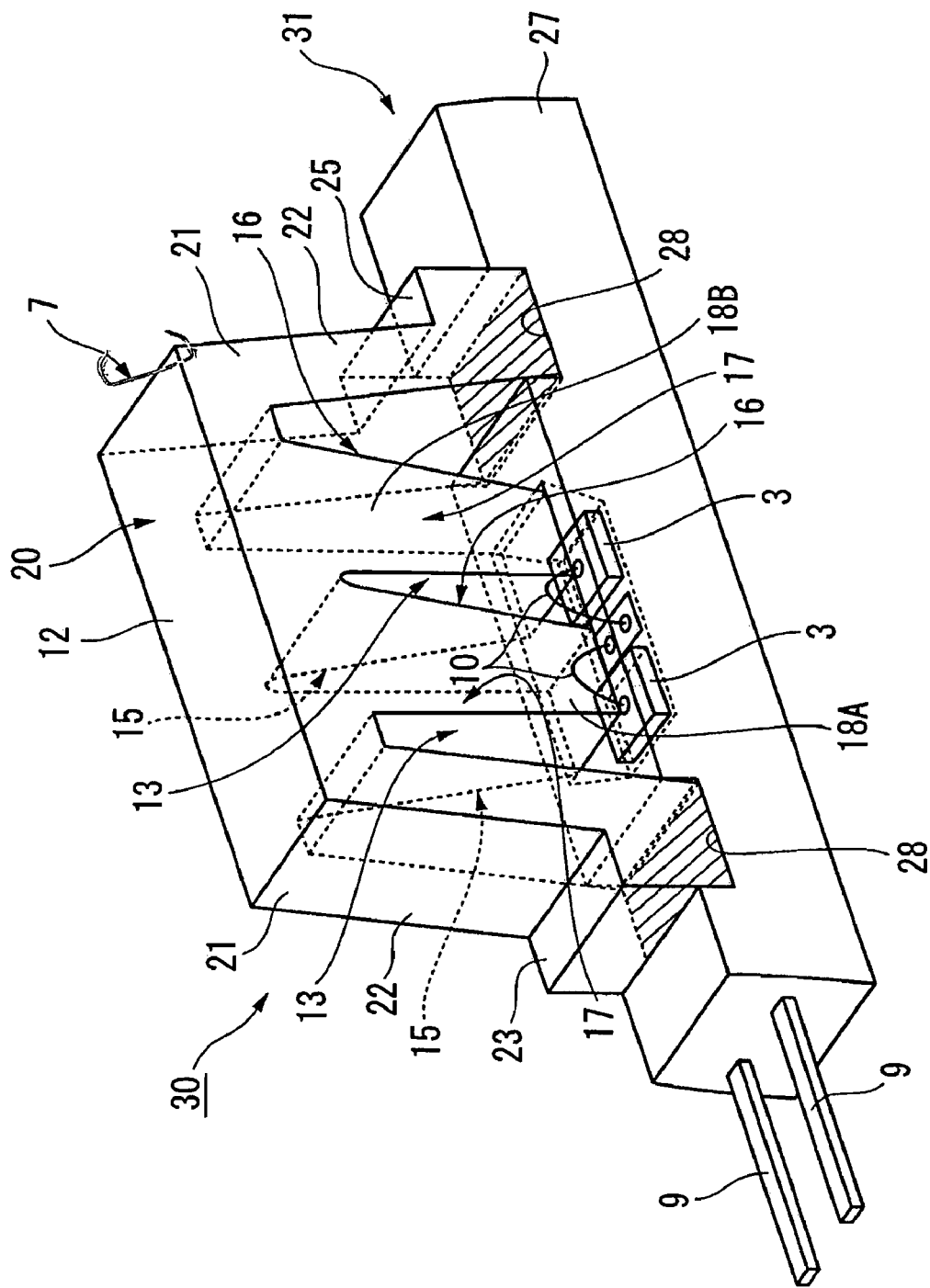
FIG. 4 is a perspective view of an arrangement using different connectors than those in the illumination apparatus according to the first embodiment of this invention.

As shown in FIG. 4, an illumination apparatus 30 may include grooves 28 capable of accommodating the connectors 23 and 25, these grooves 28 being formed in the top of a base 27 which the optical device 7 is mounted upon.

In this case, the connectors 23 and 25 are accommodated in the respective grooves 28 at the time of securing the optical device 7 to a light source 31. In addition to obtaining the same effects as those mentioned above, this enables the connectors 23 and 25 to be positioned more stably on the base 27 and to be secured more precisely to it.

Figure 5:
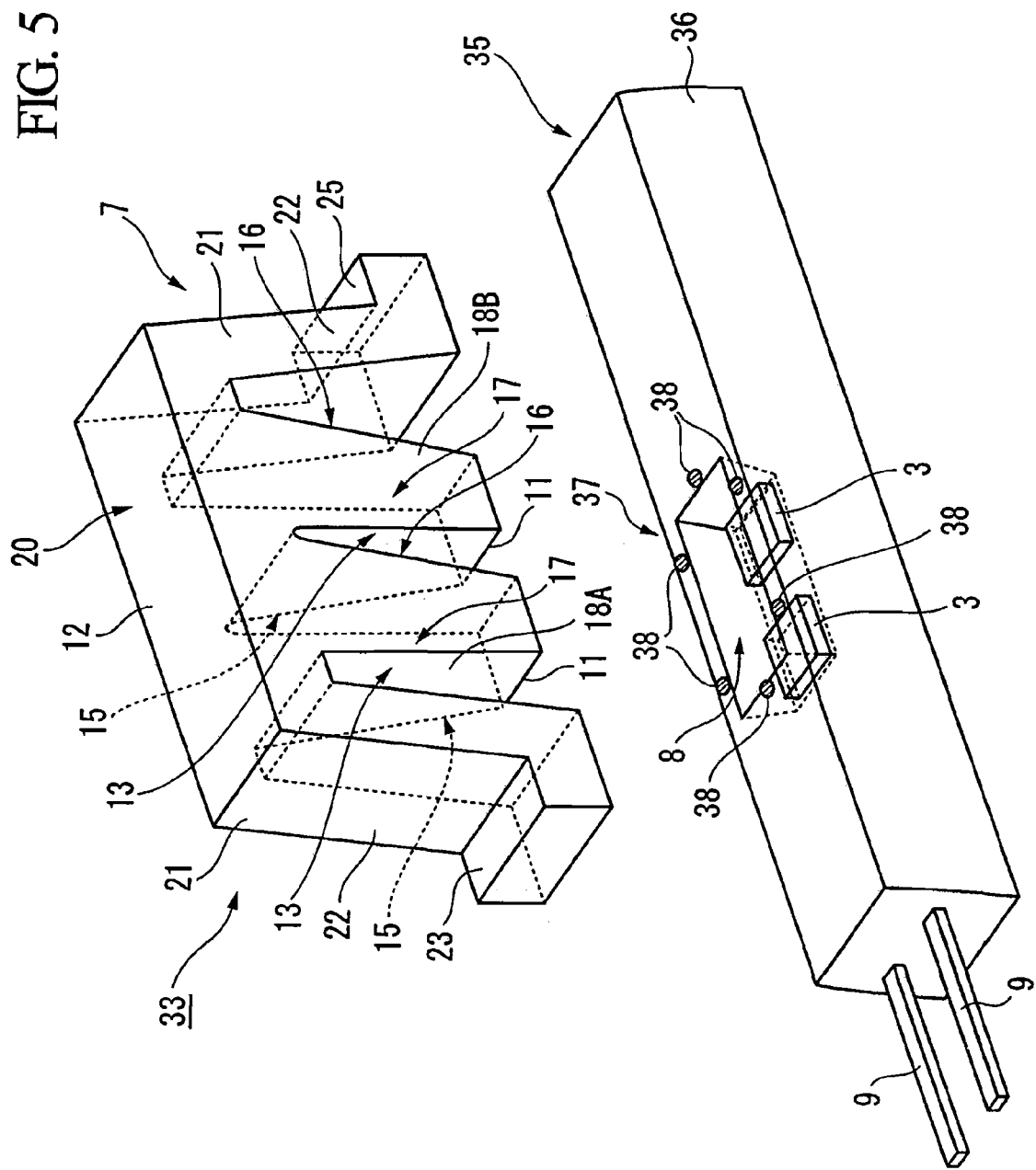
FIG. 5 is a perspective view of an illumination apparatus according to a second embodiment of this invention.

Subsequently, a second embodiment will be explained with reference to FIG. 5.

Constituent parts which are the same as those of the first embodiment described above are represented by like reference numerals and will not be repetitiously explained.

The second embodiment differs from the first embodiment in that a positioning section 37 for positioning the incidence faces 11 of the taper rods 18A and 18B is arranged in a base 36 of a light source 35 of an illumination apparatus 33 according to this embodiment.

The positioning section 37 protrudes from the top of the base 36 which the optical device 7 is attached to, and includes a plurality of protrusions 38 which are arranged along the open end of the cavity 8 in the base 36.

These protrusions 38 point-contact each of the reflection faces 13, 15, 16, and 17 near the incidence faces 11 of the taper rods 18A and 18B.

According to the illumination apparatus 33, even if the taper rods 18A and 18B become warped, at the time of connecting the optical device 7 to the light source 35, the positions of the incidence faces 11 with respect to the base 36 can be adjusted while striking the reflection faces 13, 15, 16, and 17 of the taper rods 18A and 18B against the protrusions 38. This enables the incidence faces 11 of the taper rods 18A and 18B to be positioned more precisely and more easily with respect to the LEDs 3.

Figure 6:
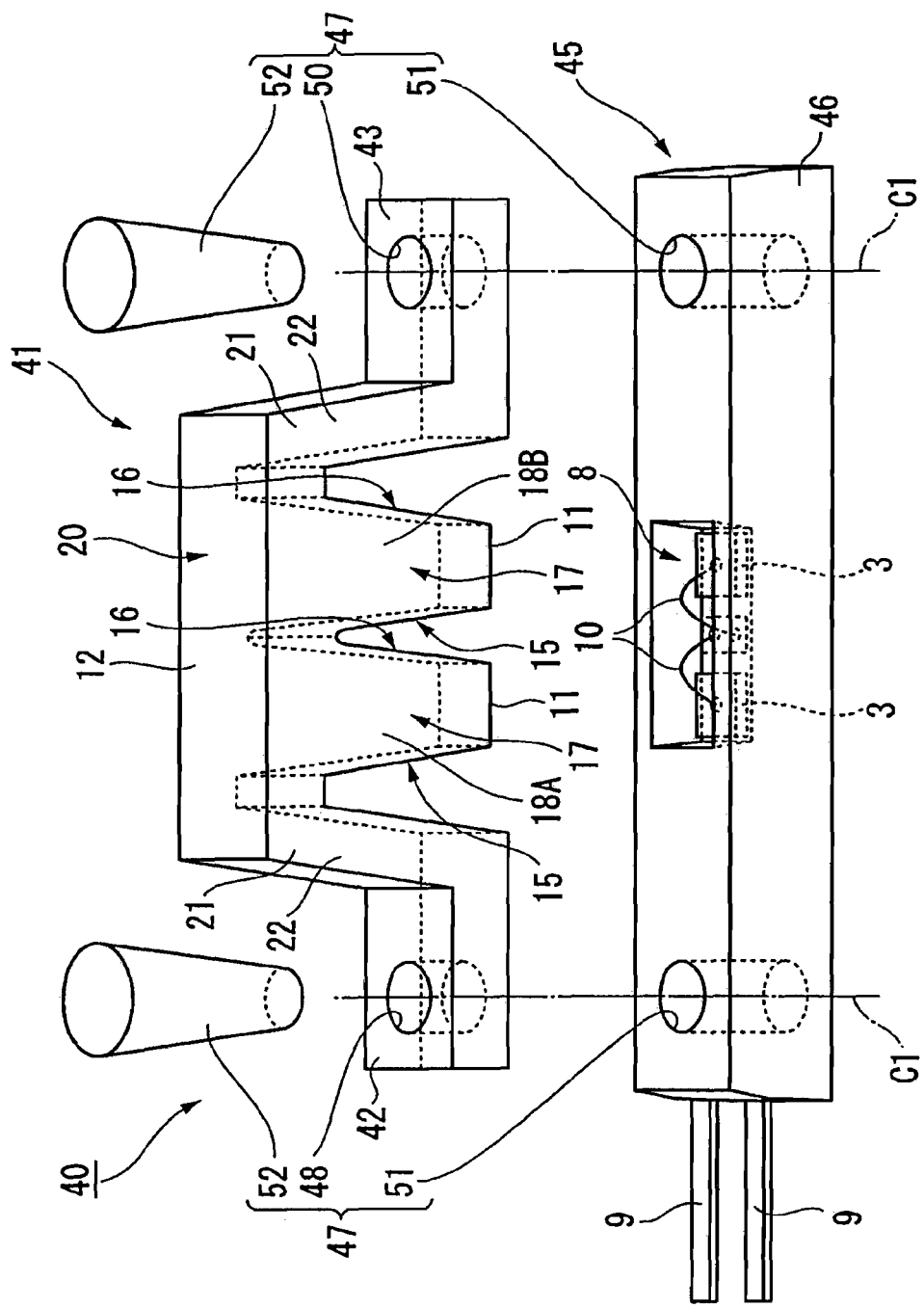
FIG. 6 is a perspective view of the configuration of an illumination apparatus according to a third embodiment of this invention.

A third embodiment will be explained with reference to FIG. 6.

Constituent parts which are the same as those of the other embodiments described above are represented by like reference numerals and will not be repetitiously explained.

The third embodiment differs from the first embodiment in that it includes securing sections 47 which secure connectors 42 and 43 in an optical device 41 of an illumination apparatus 40 of this embodiment to a base 46 of a light source 45.

Each securing section 47 consists of holder side through-holes 48 and 50 which are respectively provided in the connectors 42 and 43 and face the base 46 side, a base side through-hole 51 which is provided in the base 46 and can be linked to the holder side through holes 48 and 50, and a metallic pointed pin 52 which is inserted into the base side through-hole 51 and the holder side through-holes 48 and 50. The pins 52 need not be made from metal, and can be made from a resin such as polycarbonate instead.

The base side through-hole 51 has a smaller diameter than the holder side through-holes 48 and 50. The shape of one of the holder side through-holes 48 and 50 is elongated.

The tip of each pin 52 is small enough that it can be inserted through the through-holes 48, 50, and 51, while the diameter of the base of the pin 52 is larger than the diameter of the through-holes 48, 50. The size of the tip of the pin 52 is such that, when the tip is buried inside the base 46 by insertion in this manner, the pin 52 fits exactly into the base side through-hole 51.

When manufacturing the illumination apparatus 40, the optical device 41 is disposed on the base 46 such that the incidence faces 11 of the taper rods 18A and 18B are inserted into the cavity 8 where the LEDs 3 are mounted, as in the first embodiment.

The optical device 41 is disposed on the base 46 such that the holder side through-holes 48 and 50 and the base side through-holes 51 are aligned with respective central axis lines C1. The pins 52 are then inserted into the holder side through-holes 48 and 50 from the back plane 41 side, and pressingly clipped into the base side through-holes 51.

The cavity 8 is filled with the sealing resin 26 to obtain the illumination apparatus 40.

Alternatively, the connectors 42 and 43 may be secured to the base 46 after filling the cavity 8 with the sealing resin 26, while joining the sealing resin 26 to the incidence faces 11 of the taper rods 18A and 18B in an airtight connection.

According to this illumination apparatus 40, the optical device 41 is disposed on the base 46 such that the holder side through-holes 48 and 50 link with the base side through-holes 51, and the pins 52 are inserted through these holes. Therefore, the optical device 41 can be firmly secured in position to the base 46.

Figure 7:
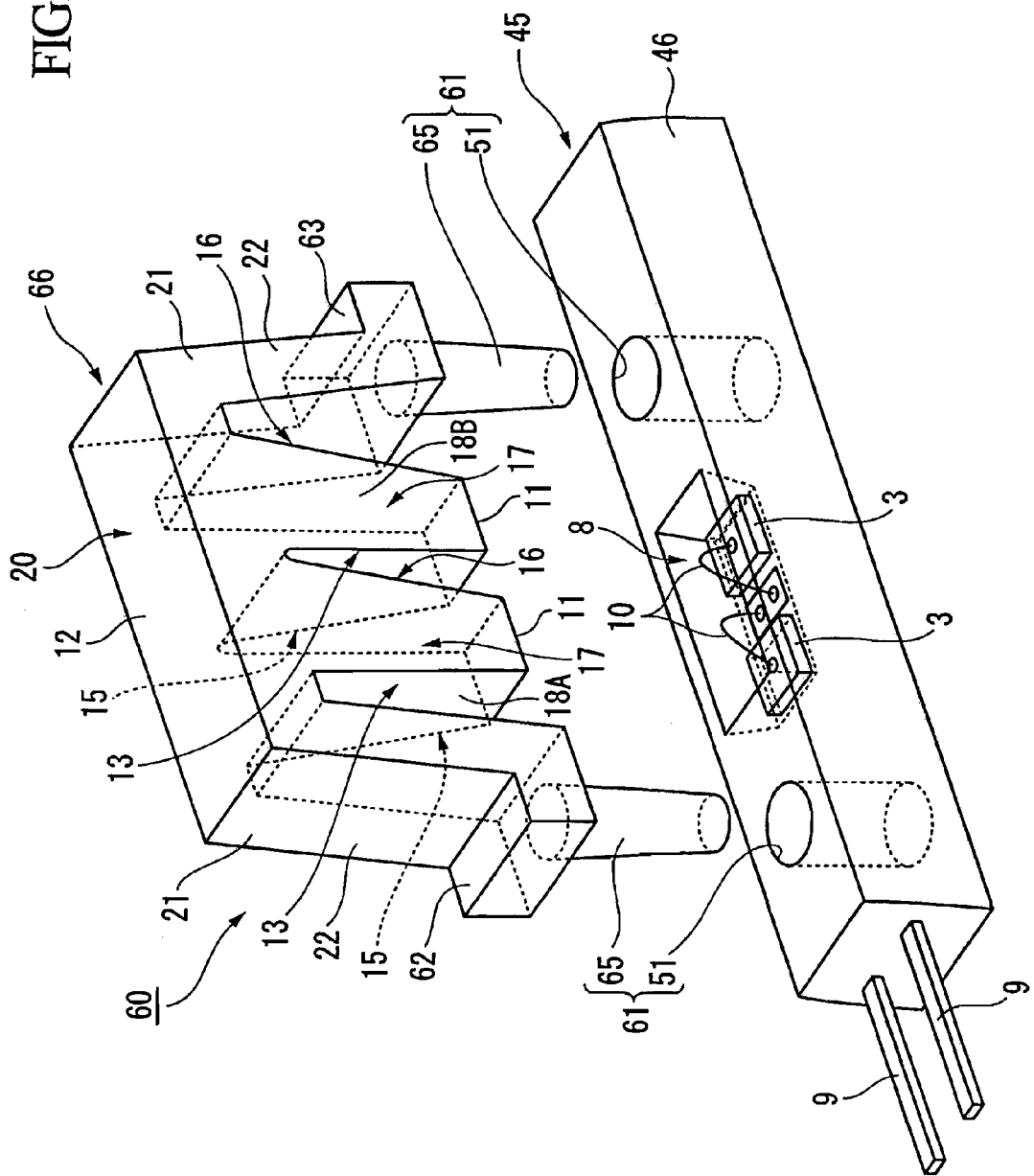
FIG. 7 is a perspective view of the configuration of an illumination apparatus according to a fourth embodiment of this invention.

Subsequently, a fourth embodiment will be explained with reference to FIG. 7.

Constituent parts which are the same as those of the other embodiments described above are represented by like reference numerals and will not be repetitiously explained.

The fourth embodiment differs from the third embodiment in that, instead of the holder side through-holes 48 and 50, securing sections 61 of an illumination apparatus 60 according to this embodiment include pointed pins 65 which protrude in the direction of the base 46 and connect in a single piece to connectors 62 and 63.

While in the third embodiment, the pins 52 are formed separately from the optical device 41, in this embodiment the pins 65 are formed in a single piece with an optical device 66.

According to this embodiment, the pins 65 are small enough that their tips can be inserted into the base side through-holes 51, and their bases have larger diameters than the base side through-holes 51. The size of the tip of each pin 65 is such that, when the tip is buried inside the base 46 by insertion in this manner, the pin 65 fits exactly into the base side through-hole 51.

The illumination apparatus 60 obtains the same effects and advantages as the third embodiment. In particular, since the pins 65 are formed in a single piece with the optical device 66, the number of components can be reduced and the invention can be assembled at lower cost.

Figure 8:
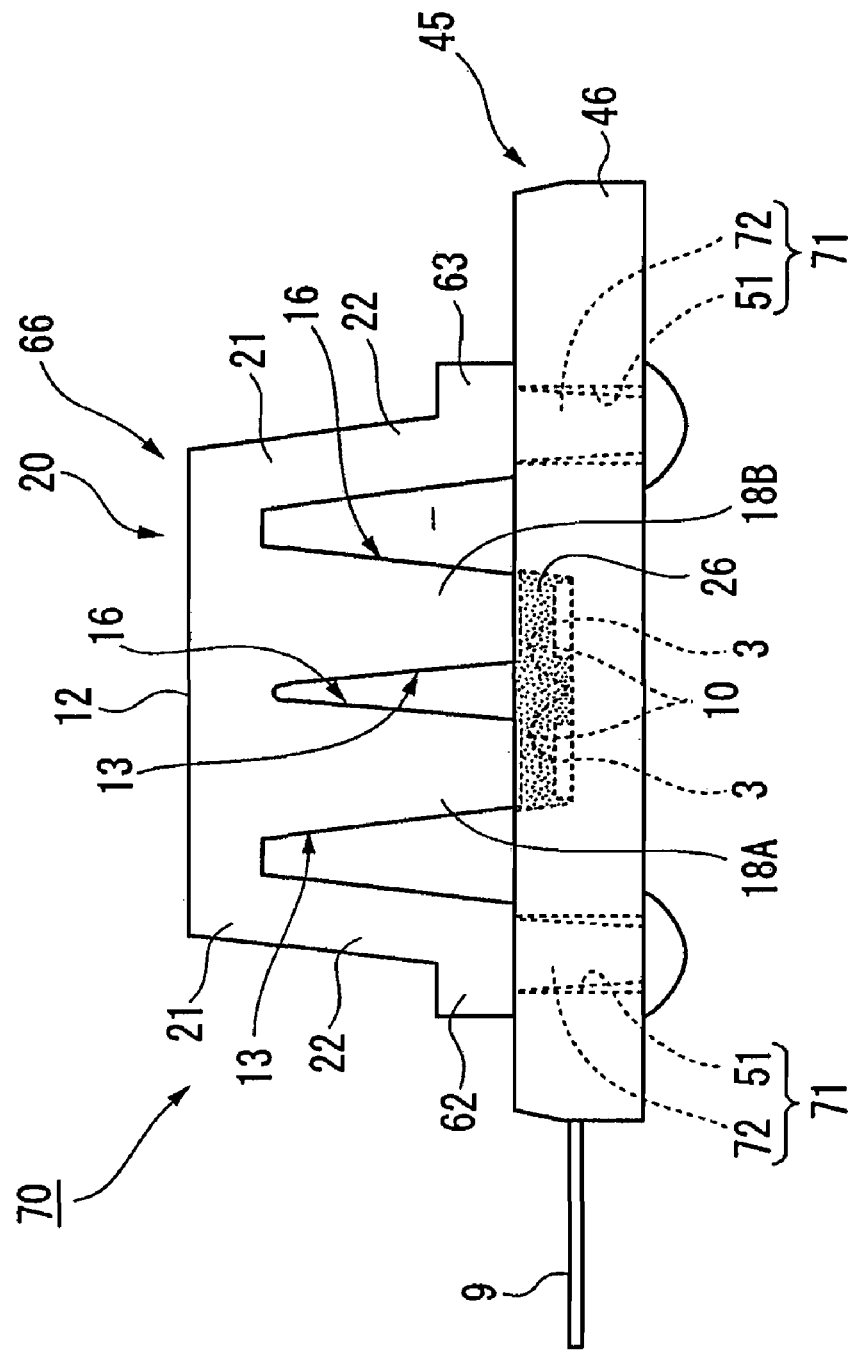
FIG. 8 is a frontal view of an illumination apparatus according to a fifth embodiment of this invention.

Subsequently, a fifth embodiment will be explained with reference to FIG. 8.

Constituent parts which are the same as those of the other embodiments described above are represented by like reference numerals and will not be repetitiously explained.

The fifth embodiment differs from the fourth embodiment in that pins 72 of securing sections 71 of an illumination apparatus 70 according to this embodiment are long enough to pass through the base side through-holes 51 and protrude after being inserted, these protruding sections being thermally crimped to the base 46.

According to the illumination apparatus 70, thermally crimping the pins 72 to the base 46 enables the optical device 66 to be secured more firmly to the light source 45, there being no need to use an adhesive.

Figure 9:
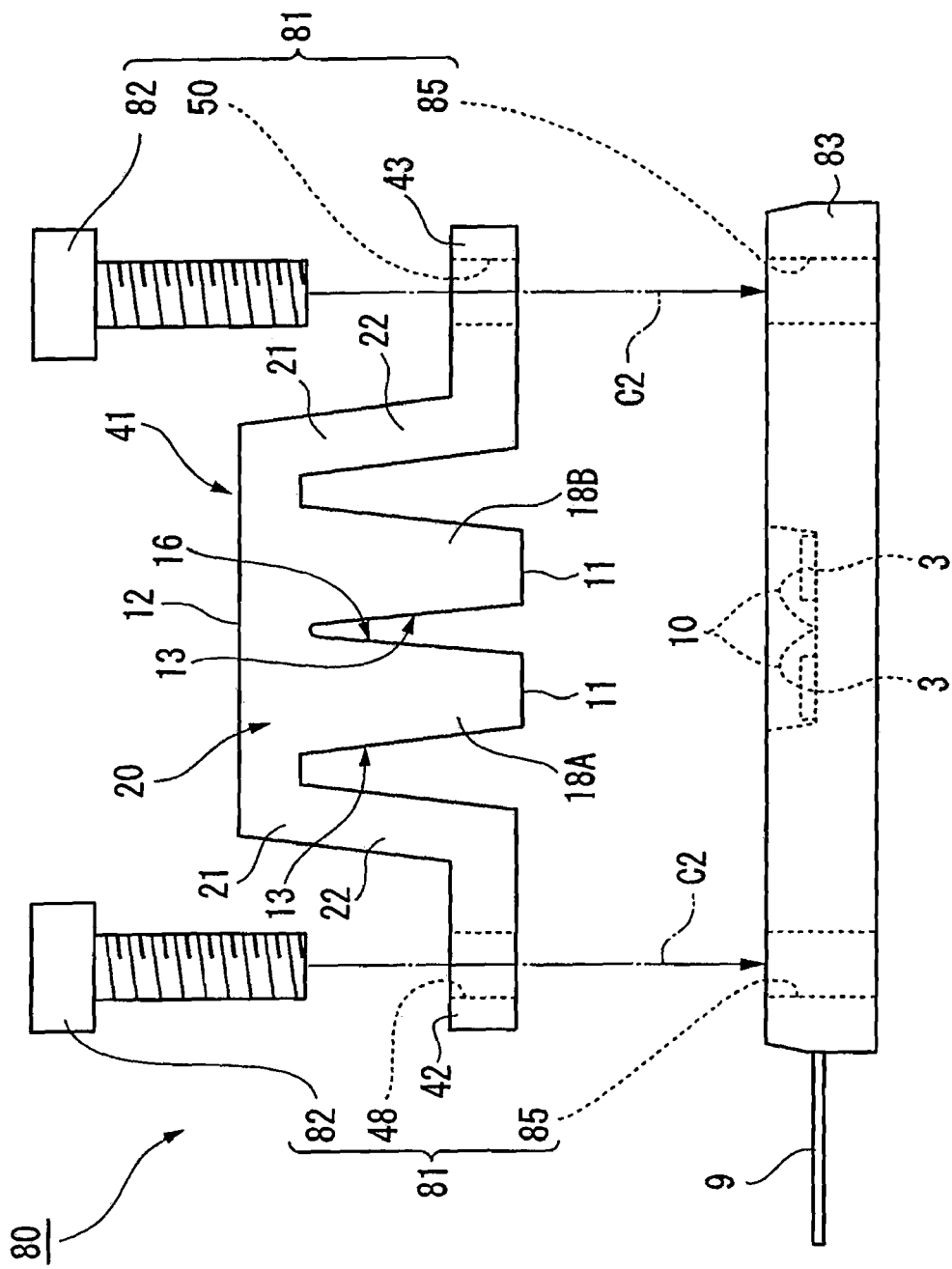
FIG. 9 is a frontal view of the configuration of an illumination apparatus according to a sixth embodiment of this invention.

Subsequently, a sixth embodiment will be explained with reference to FIG. 9.

Constituent parts which are the same as those of the other embodiments described above are represented by like reference numerals and will not be repetitiously explained.

The sixth embodiment differs from the third embodiment in that securing sections 81 of an illumination apparatus 80 according to this embodiment include, instead of the pins 52, external screw sections 82 which can be inserted through the holder side through-holes 48 and 50, and, instead of the base side through-holes 51, internal screw sections 85 which are formed in the base 46 and which the external screw sections 82 can be screwed into after being inserted through the holder side through-holes 48 and 50.

When manufacturing the illumination apparatus 80, the optical device 41 is disposed on the base 46 such that the incidence faces 11 of the taper rods 18A and 18B are inserted into the cavity 8 where the LEDs 3 are mounted.

At this time, the optical device 41 is disposed on the base 46 such that the holder side through-holes 48 and 50 and the internal screw sections 85 are aligned with respective central axis lines C1. The external screw sections 82 are then inserted into the holder side through-holes 48 and 50 from the optical device 41 side, and are tightly screwed in place after their tips reach the internal screw sections 85.

In this way, the illumination apparatus 80 is obtained by filling the sealing resin 26 in the cavity 8.

According to this illumination apparatus 80, instead of pressingly inserting the pins 52 into the base side through-holes 51 as in the third embodiment, the external screw sections 82 are screwed into the internal screw sections 85, obtaining the same effects and advantages. In particular, since the joint is accomplished by screwing, it can be secured more firmly than by a pin joint, keeping the positioning highly precise.

Figure 10:
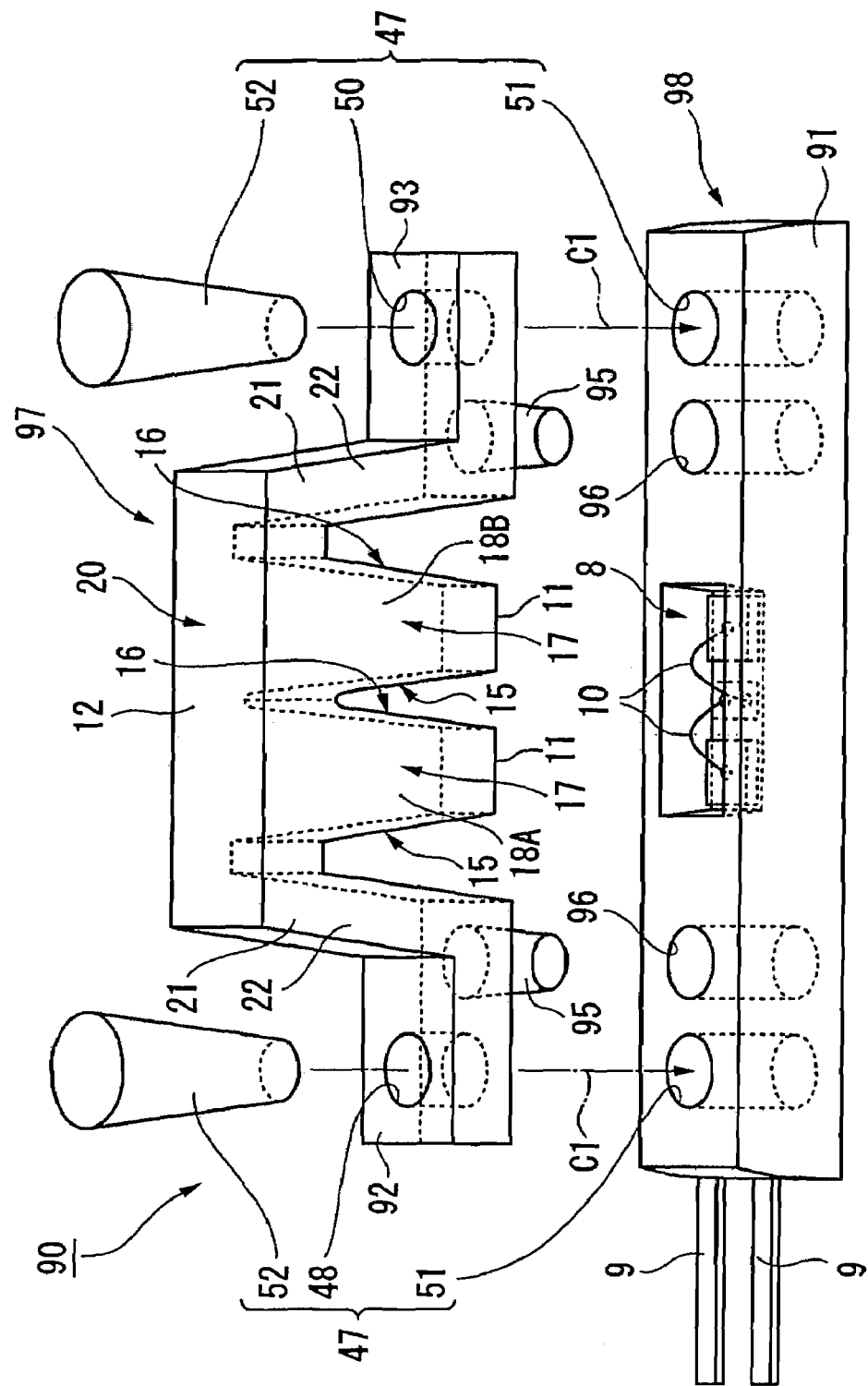
FIG. 10 is a perspective view of the configuration of an illumination apparatus according to a seventh embodiment of this invention.

Subsequently, a seventh embodiment will be explained with reference to FIG. 10.

Constituent parts which are the same as those of the other embodiments described above are represented by like reference numerals and will not be repetitiously explained.

The seventh embodiment differs from the third embodiment in that an illumination apparatus 90 according to this embodiment includes, in addition to the securing sections 47, second pins (convexities) 95 which are fitted to the connectors 92 and 93 respectively and protrude in the direction of a base 91, and positioning holes (concavities) 96 which are provided in the base 91 and allow the second pins 95 to be inserted therein.

According to this illumination apparatus 90, since the second pins 95 are clipped into the positioning holes 96, an optical device 97 and a light source 98 can be positioned more easily than by joining them using only the securing sections 47, and they can be connected with greater precision.

Figure 11:
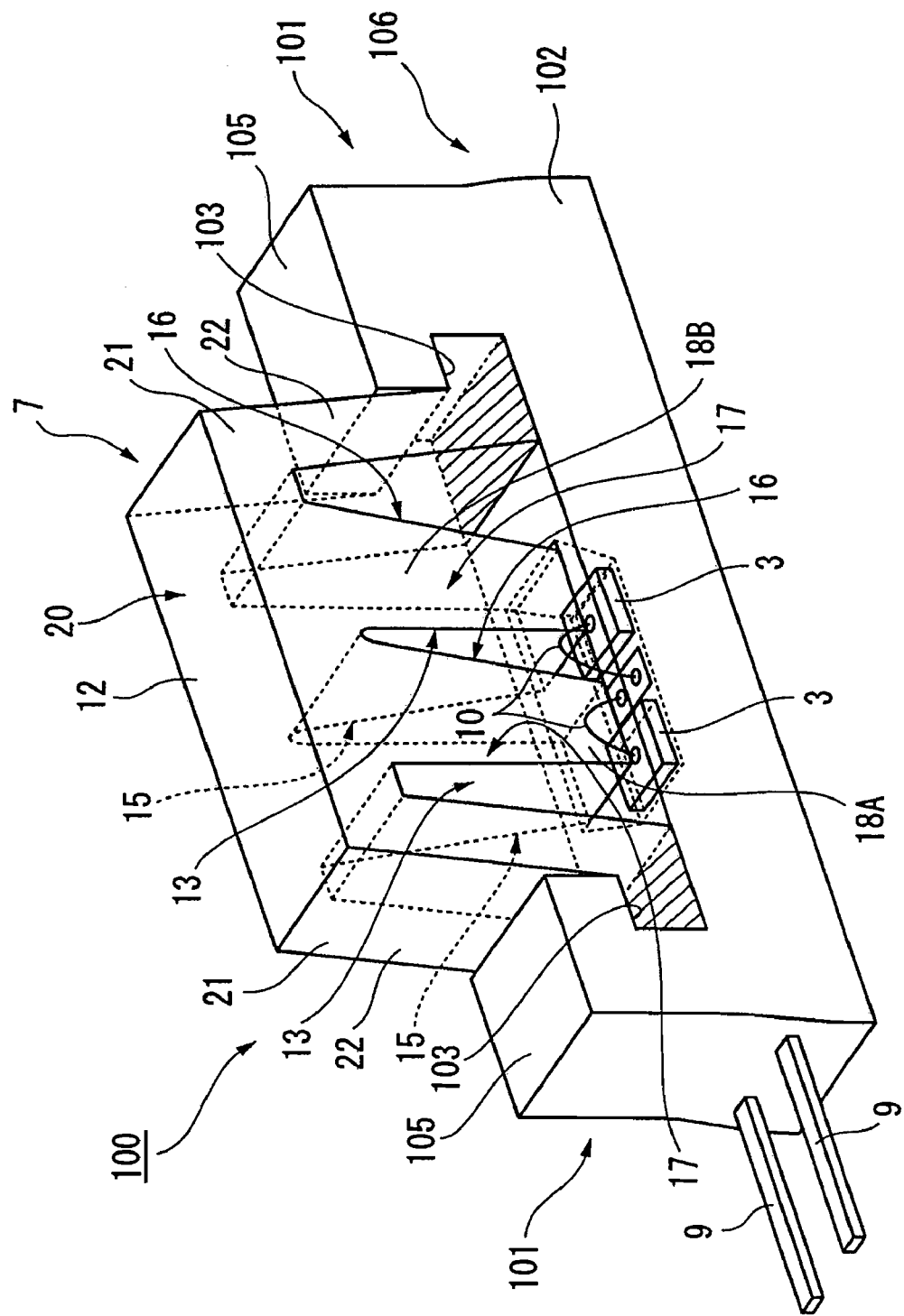
FIG. 11 is a perspective view of an illumination apparatus according to an eighth embodiment of this invention.

Subsequently, an eighth embodiment will be explained with reference to FIG. 11.

Constituent parts which are the same as those of the other embodiments described above are represented by like reference numerals and will not be repetitiously explained.

The eighth embodiment differs from the third embodiment in that securing sections 101 of an illumination apparatus 100 according to this embodiment include engaging grooves 103 which are provided in a base 102 and can be engaged with the connectors 23 and 25, and clasping members 105 which securely engage and fasten the connectors 23 and 25 into the engaging grooves 103.

At this time, the securing sections 101 are arranged such that they protrude further to the optical device 7 side than the open end of the cavity 8 of the base 102, while ensuring that the relative distance between the incidence faces 11 of the taper rods 18A and 18B and the LEDs 3 is the same as in the other embodiments.

Since the clasping members 105 has elasticity that allows an opening end of the engaging grooves 103 to be opened, they are able to bend when the connectors 23 and 25 are inserted into the engaging grooves 103.

According to this illumination apparatus 100, during manufacturing, the connectors 23 and 25 are engaged into the engaging grooves 103 and pressed by the clasping members 105, enabling the optical device 7 to be more firmly secured and more easily connected to a light source 106 without providing new components for the securing sections 101.

While preferred embodiments of the invention have been described and illustrated above, it should be understood that these are exemplary of the invention and are not to be considered as limiting. Additions, omissions, substitutions, and other modifications can be made without departing from the spirit or scope of the present invention.

For example, although the positioning section 37 according to the second embodiment is provided in the illumination apparatus 1 which is shaped according to the first embodiment, it may be combined with a securing section of another embodiment.

It would also be acceptable to adhesively secure the optical device to the base together with the securing sections.

Moreover, an adhesive may be applied to the pins 52 and the like to secure them adhesively.

While in the seventh embodiment, the second pins 95 and the positioning holes 96 are provided to an illumination apparatus according to the third embodiment, the securing sections used here are not limited to pins, it being acceptable to use screws instead, or to use only adhesion without the securing sections.

According to this invention, illuminating light from a light source can be efficiently guided and emitted with high precision. Furthermore, the number of components and the manufacturing cost can be reduced.

What is claimed is:

1. An optical device which guides illuminating light from a light source comprising:
   a light-guiding unit including an incidence face which the illuminating light from the light source is incident upon, an emission face which emits the illuminating light and has a larger area than the incidence face, and a reflection face which guides rays of the illuminating light which are incident from the incidence face to the emission face; and
   a holder which secures the light-guiding unit in position with the light source;
   wherein the light-guiding unit and the holder are connected together on the emission face side of the light-guiding unit.

2. The optical device of claim 1, wherein the holder includes a connector for connecting to the light source.

3. The optical device of claim 2, wherein the light source comprises a base and a light emitting diode positioned on the base; and
   the connector is secured to the base.

4. The optical device of claim 3, further comprising:
   a holder side through-hole is provided in the connector;
   a base through-hole provided in the base and positioned to be aligned with the holder side through-hole; and
   a pin which can be inserted through the holder side through-hole and the base side through-hole.

5. The optical device of claim 3, wherein
   the connector includes a pin which protrudes in the direction of the base side; and
   a base through-hole is provided in the base and positioned to allow the pin to be inserted therein.

6. The optical device of claim 5, wherein the pin is formed in a single piece with the connector.

7. The optical device of claim 5, wherein the light guiding member, holder, connector, and pin are molded together in a single piece.

8. The optical device of claim 5, wherein the pin is adhesively secured to the connector.

9. The optical device of claim 3, wherein
   the connector includes an adjustable fastener which protrudes in the direction of the base side; and
   a through-hole is provided on the base and positioned to allow the adjustable fastener to be inserted therein.

10. The optical device of claim 3, wherein the connector includes a pair of elongated extension members which protrude in the direction of the base; and
    a pair of through-holes provided in the base and positioned to allow the elongated extension members to be inserted therein.

11. The optical device of claim 1, wherein light guiding member and the holder are molded together in a single piece.

12. The optical device of claim 1, wherein the holder includes an elongated extension member which protrudes from the holder in the direction of the light source; and
    the light source includes a through-hole which is positioned to allow the elongated extension member to be inserted therein.

13. The optical device of claim 12, wherein the elongated extension member is adjustably secured to the light source.

14. The optical device of claim 1, wherein the reflection face brings the rays of illuminating light to total internal reflection.

15. An optical element which is securable to a light source, the optical element comprising:
    a light-guiding unit including an incidence face which illuminating light from the light source is incident upon, an emission face which emits the illuminating light and has a larger area than the incidence face, and a reflection face which guides rays of the illuminating light which are incident from the incidence face to the emission face; and
    a holder having a first side connected to the emission face side of the light guiding unit and a second side having an elongated extension member;
    wherein the light source includes a base and a light emitting diode positioned on the base, the base having a through-hole positioned to allow the elongated extension member to be inserted therein to secure the optical element to the light source.

16. A method of mounting an optical device to a light source, the method comprising:
    providing an optical device including:
      a light-guiding unit having an incidence face which illuminating light from the light source is incident upon, an emission face which emits the illuminating light and has a larger area than the incidence face, and a reflection face which guides rays of the illuminating light which are incident from the incidence face to the emission face; and
      a holder having a first portion connected to the emission face side of the light guiding unit and a second portion having an elongated extension member;
    providing a light source including a base having a through-hole and a light emitting diode positioned on the base; and
    inserting the elongated extension member into the through-hole in the base to secure the optical device to the light source.

* * * * *